(12) United States Patent
Zhu et al.

(10) Patent No.: US 6,778,111 B1
(45) Date of Patent: Aug. 17, 2004

(54) MULTI-DIMENSIONAL DEGLITCH FILTER FOR HIGH SPEED DIGITAL SIGNALS

(75) Inventors: Zhubiao Zhu, Fort Collins, CO (US); Kenneth Koch, II, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/653,341

(22) Filed: Sep. 2, 2003

(51) Int. Cl.[7] .................................................. H03M 1/00
(52) U.S. Cl. ...................................... 341/134; 708/300
(58) Field of Search ................................. 341/134, 170, 341/120, 118; 327/37, 263, 552, 553; 708/300

(56) References Cited

U.S. PATENT DOCUMENTS

| | | | | |
|---|---|---|---|---|
| 5,341,033 A | * | 8/1994 | Koker | ........................ 327/206 |
| 6,137,333 A | * | 10/2000 | Williams et al. | ............. 327/261 |
| 6,348,780 B1 | * | 2/2002 | Grant | ......................... 323/222 |
| 6,405,228 B1 | * | 6/2002 | Williams et al. | ............ 708/300 |
| 2002/0000927 A1 | * | 1/2002 | Angelici et al. | ............. 341/150 |

* cited by examiner

Primary Examiner—Brian Young
Assistant Examiner—John B Nguyen

(57) ABSTRACT

A system and method provide deglitch filtering. The system has a voltage-based deglitching filter and timing-based deglitching filter. The voltage-based deglitching filter connects with the timing-based deglitch filter, such that the output of the voltage-based deglitch filter connects to the input of the timing-based deglitch filter. The voltage-based deglitch filter is in feedback with the timing based deglitching filter.

20 Claims, 4 Drawing Sheets

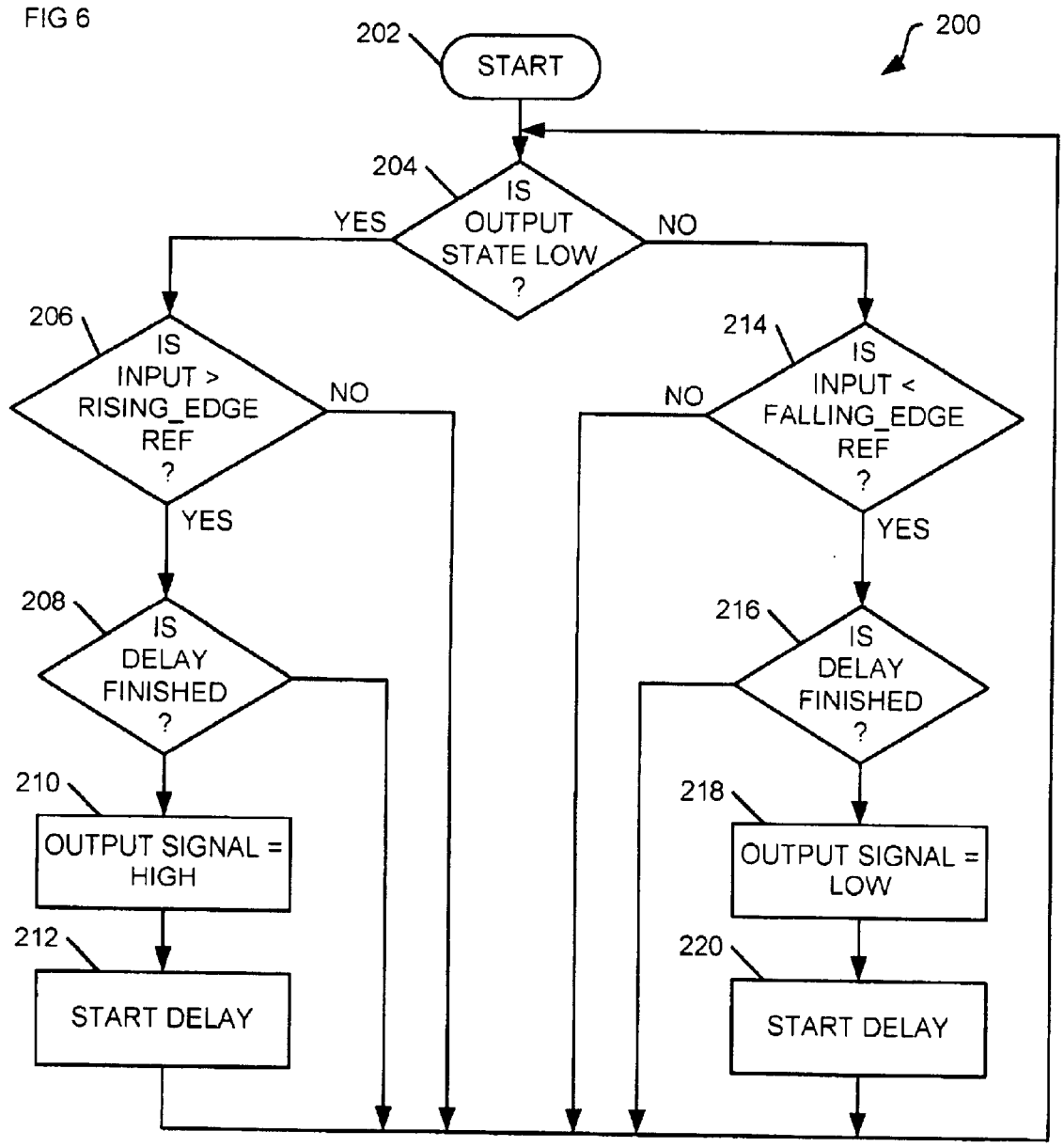

MULTI-DIMENSIONAL DEGLITCH FILTER FOR HIGH SPEED DIGITAL SIGNALS

BACKGROUND

With increasing processing speed of digital signals in modern circuits, the effect of noise on these signals becomes more problematic. This problem is further exacerbated when a number of digital circuits connect to a single bus and receive the same signal.

Many techniques have been employed to reduce noise sensitivity of such circuits. Foremost among these techniques is to sample data at a time when the data is expected to be stable. In signals where the information content is coincident with the edge of the waveform, such as a strobe and clock signal (e.g., signals that are used to clock state machines), this sampling technique is, however, not suitable; in this situation a "glitch" can cause a significant problem. A "glitch" is a short pulse or noise spike to which circuit response is not desired.

One technique for reducing circuit sensitivity to glitch noise is to utilize a voltage-based "deglitch" filter (also known as a hysteresis deglitch filter). Receivers with voltage-based deglitch filters essentially have two voltage thresholds coincident with a rising-edge and a falling-edge representing low and high circuit states. When a signal rises above the rising-edge threshold, the circuit changes state; when the signal drops below the falling-edge threshold, the circuit again changes state.

The voltage difference between voltage thresholds is known as the input hysteresis. The voltage-based deglitch filter resists noise when the noise is lower in magnitude than the amount of input hysteresis. Typically, in a bus system with multiple receiving circuits, the difference between voltage high and low thresholds is reduced, thereby reducing the amount of input hysteresis. The amount of hysteresis may not exceed the difference in the worst case signal to be received. Voltage-based deglitch filters are typically used for strobe and clock signals; however, if the noise level increases above the amount of hysteresis, glitches still occur in the receiving circuit.

Another technique for reducing sensitivity of digital signals to glitch noise is to design the circuit to respond only to input pulses that exceed a predetermined minimum pulse width, thereby ignoring pulses of lesser duration. This technique is utilized within a "timing-based" deglitch filter. Typically, the timing-based deglitch filter has a timer that is started when a first transition in the input signal is detected. If a second transition occurs before the timer expires, both the first and second transitions are ignored, thus removing the glitch. If the timer expires before the second transition occurs, the filter output transitions, thereby passing signal pulses through the filter. Thus, any transition must be present at the input longer than the periodicity of the timer. For correct operation, the predetermined minimum pulse width must be greater than the width of any encountered glitch, and less than the pulse width of any valid signal. This deglitch technique is typically used with clock signals where the clock high and low periods are much longer than the duration of any one glitch. A similar timing-based deglitch technique reduces sensitivity of digital signals to glitch noise by passing a first edge of the digital signal and suppressing subsequent edges for a time period set by a delay line duration. However, in either type of timing-based deglitch technique, as the data rate of digital signals increases, the glitch duration often matches or exceeds the duration of the clock and strobe signal pulse, in which case the glitch is not removed.

Voltage-based and timing-based deglitch filters may be used separately or in series. When used serially, the voltage-based deglitch filter is concatenated with the timing-based deglitch filter and both filters operate independently of one another. Accordingly, a signal used to select the threshold voltage in the voltage-based deglitch filter is taken directly from the output of the voltage-based deglitch filter. The output of the voltage-based deglitch filter is then input to the timing-based filter. The timing-based deglitch filter thereby has no direct influence over the voltage-based deglitch filter. While this concatenation of voltage-based and timing-based deglitch filters may improve signal quality for certain types of glitch noise, it is not sufficient to remove glitch noise for modern high frequency bus signals.

For example, U.S. Pat. No. 5,341,033 (the '033 patent) describes a deglitch circuit using a hysteresis buffer with two levels of hysteresis and a timer. When the hysteresis buffer detects a transition, the timer is triggered. The timer is in feedback with the hysteresis buffer to increase the buffer's hysteresis, thereby ignoring glitches until the timer expires. The circuit of the '033 patent is a first-edge pass (timing-based) noise protection circuit with hysteresis. It is more suited to input signals with short duration glitches (i.e., glitches close to the active edge of the input signal). The '033 patent is incorporated herein by reference.

SUMMARY OF THE INVENTION

In various embodiments, a system removes glitch noise from a signal. The system includes a voltage-based deglitch filter and a timing-based filter. The signal is input to the voltage-based deglitch filter, filtered through the voltage-based and timing-based filters, and output from the timing-based filter. The output from the timing-based filter is also input to the voltage-based filter in feedback to provide enhanced filtering of the glitch noise.

In certain embodiments, a method filters glitch noise from a signal. A voltage-based deglitch filter is concatenated with a liming-based deglitch filter. A feedback is enabled from an output of the timing-based deglitch filter to an input to the voltage-based deglitch filter. The signal is also input to the input of the voltage-based deglitch filter; it is then filtered when processed by both the voltage-based deglitch filter and the timing-based deglitch filter.

In various embodiments, the step of filtering includes the steps of (a) communicating the glitch noise from the voltage-based deglitch filter to the timing-based deglitch filter within the logical signal when the noise glitch exceeds an input hysteresis of the voltage-based deglitch filter and (b) removing the glitch noise from the logical signal within the timing-based deglitch filter when the glitch noise from the logical signal has a width that is less than a predetermined signal delay duration within the timing-based deglitch filter.

BRIEF DESCRIPTION OF THE FIGURES

FIG. 6 shows one process for removing glitch noise on a bus with high speed digital signals.

DETAILED DESCRIPTION OF THE FIGURES

Figure 1:
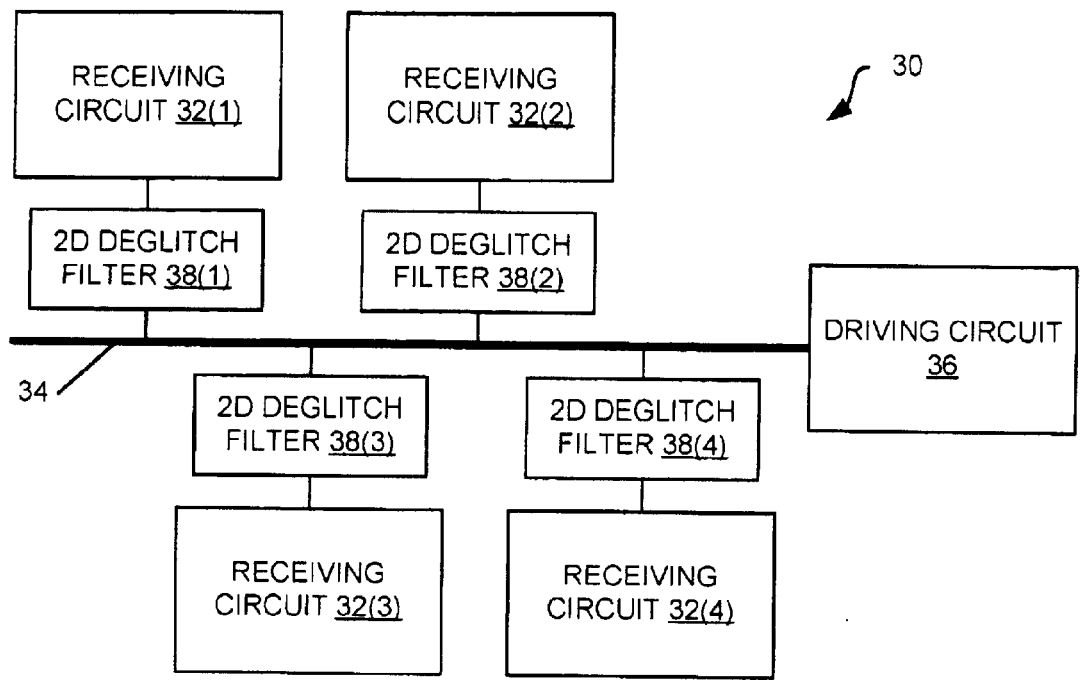
FIG. 1 is a block schematic diagram illustrating one system for deglitching high speed digital signals.

FIG. 1 shows one system 30 with four receiving circuits 32, four two-dimensional deglitch filters 38, and a driving circuit 36 connected to a single bus 34. In operation, driving circuit 36 generates high speed digital signals with glitch noise on bus 34. Two-dimensional deglitch circuit 38(1) filters the glitch noise for receiving circuit 32(1); two-dimensional deglitch circuit 38(2) filters the glitch noise for receiving circuit 32(2); two-dimensional deglitch circuit 38(3) filters the glitch noise for receiving circuit 32(3); and two-dimensional deglitch circuit 38(4) filters the glitch noise for receiving circuit 32(4). Such filtering is performed prior to receipt of the high speed digital signals by each respective receive circuit 32.

Four receiving circuits 32 and four associated two-dimensional deglitch filters 38 are shown for the purpose of illustration. More or fewer receiving circuits 32 and two-dimensional deglitch filters 38 can exist as a matter of design choice. Bus 34 may represent any high speed digital connection. For example, bus 34 may represent copper tracks on a printed circuit board that connect a high speed processor to a memory device.

Figure 2:
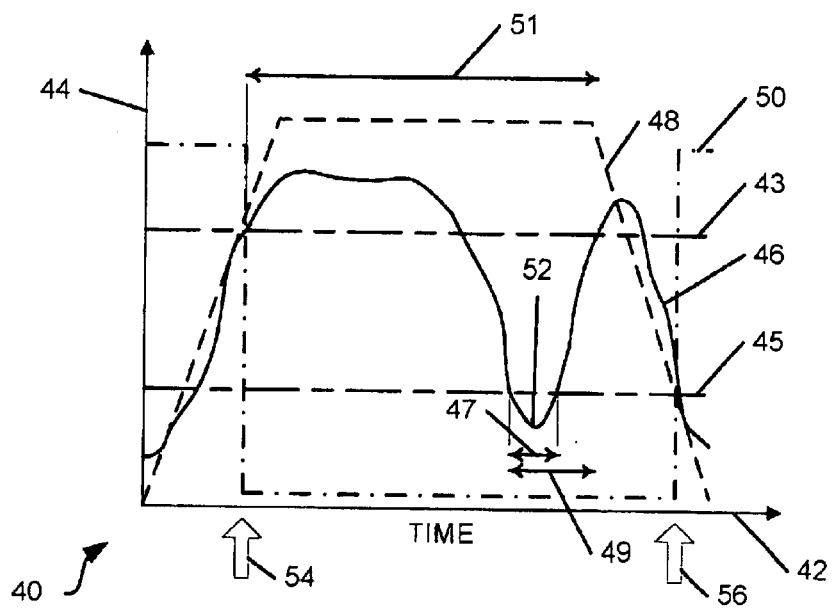
FIG. 2 is a graph illustrating a bus signal with noise, an ideal signal without noise and a signal showing logic levels corresponding to the ideal signal.

FIG. 2 is a graph 40 showing one example of a high speed digital signal 46 received by 2D deglitch filter 38, FIG. 1, from driving circuit 36 over bus 34. Digital signal 46 illustratively has a rising-edge 54 and a falling-edge 56 and represents a digital signal affected by noise. X-axis 42 represents time and y-axis 44 represents signal voltage. Falling-edge reference 45 and rising-edge reference 43 represent input hysteresis voltages used by 2D deglitch filter 38. For comparison, an ideal signal 48 is shown without noise. Signal 46 shows a significant deviation 52 from ideal signal 48. Glitch duration 51 represents a time interval between signal 46 rising above rising-edge reference 43 and deviation 52 rising above rising-edge reference 43. Glitch effective width ("GEW") 47 represents a time interval during which deviation 52 is below falling-edge reference 45. Glitch effective wide width ("GEWW") 49 represents a time interval between deviation 52 falling below falling-edge reference 45 and rising above rising-edge reference 43. Deviation 52 is removed by 2D deglitch filter 38 to produce logic signal 50. Those having ordinary skill in the art appreciate that digital signal 46 continues with other half-cycles and that other deviations 52 may be removed from such half-cycles.

Figure 3:
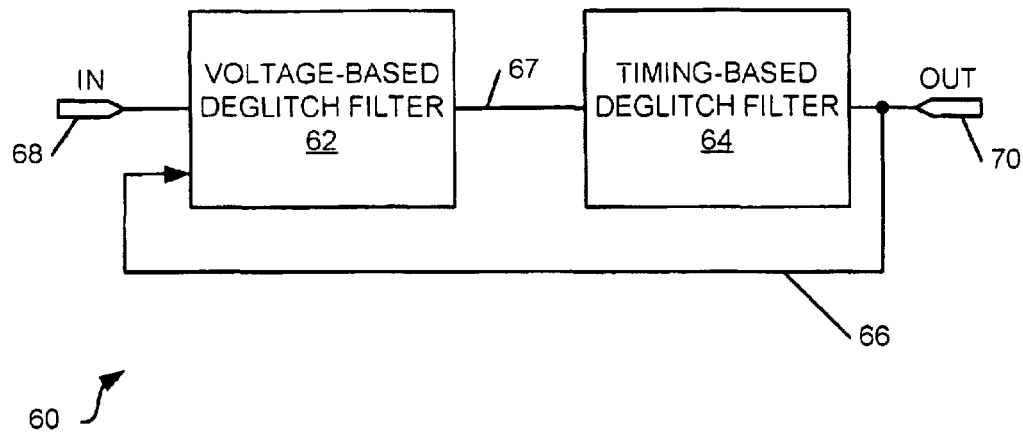
FIG. 3 is a block diagram illustrating one deglitch filter.

FIG. 3 is a block diagram illustrating one two-dimensional deglitch filter 60. Filter 60 has a voltage-based deglitch filter 62 that operates in feedback with a timing-based deglitch filter 64, to provide combined and improved deglitching performance. In operation, a high speed digital signal is applied to an input 68 of filter 60 and processed by voltage-based deglitch filter 62. A logical signal 67, output by voltage-based deglitch filter 62, is input to timing-based deglitch filter 64. A feedback signal 66 from an output 70 of timing-based deglitch filter 64 is fed back to voltage-based deglitch filter 62, as shown, and provides threshold voltages used to decode the high speed signal at input 68. Feedback signal 66 combines the operation of voltage-based deglitch filter 62 and timing-based deglitch filter 64 to provide enhanced performance. Output 70 of filter 60 provides a high speed signal free of glitches as compared to the high speed signal at input 68.

Figure 4:
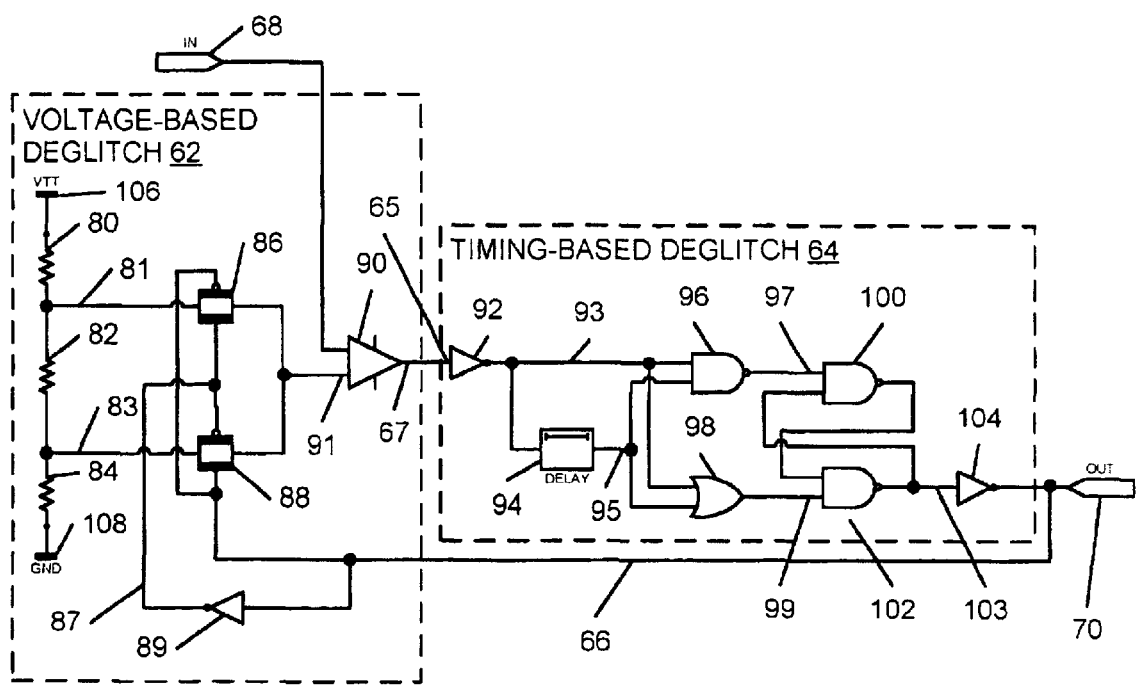
FIG. 4 is a schematic design of one two-dimensional deglitch filter.

FIG. 4 is a schematic diagram illustrating one embodiment of two-dimensional glitch filter 60, FIG. 3. Input 68 connects a high speed digital signal to a positive input of a differential receiver 90. A negative input 91 of differential receiver 90 is connected to one of two reference voltages: (a) a rising-edge reference 81 and (b) a falling-edge reference 83. References 81 and 83 are created by a resistor network consisting of three resistors 80, 82 and 84 connected in series across bus supplied power voltage terminal terminal ("VTT") 106 and ground ("GND") 108.

Pass gates 86 and 88 switch rising-edge reference 81 and falling-edge reference 83, respectively. Pass gates 86 and 88 are controlled by feedback signal 66, connected to output 70 of timing-based deglitch filter 64, and its inverse signal 87, created from feedback signal 66 after inverter 89. When output 70 is high, pass gate 88 is enabled to connect falling-edge reference 83 to negative input 91, and pass gate 86 is disabled to disconnect rising-edge reference 81. Similarly, when output 70 is low, feedback signal 66 and inverse signal 87 enable pass gate 86 to connect rising-edge reference 81 to negative input 91, disabling pass gate 88 and disconnecting falling-edge reference 83.

Logical signal 67 from differential receiver 90 connects to timing-based deglitch filter 64. In particular, signal 67 connects to an input 65 of an inverter 92 within deglitch filter 64. An output from inverter 92 (signal 93) connects to an input of a signal delay 94, a first input of a NAND gate 96 and a first input of an OR gate 98. Signal delay 94 is designed to have a duration longer than any GEW 47, FIG. 2, as output from voltage-based deglitch filter 62, but shorter than any valid input signal pulse. An output from signal delay 94 (signal 95) is fed into a second input of NAND gate 96 and a second input of OR gate 98.

NAND gates 100 and 102 are configured as a latch. A latch has two inputs, a 'set' signal 97 and a 'reset' signal 99, and one output signal 103. A negative pulse on set signal 97 sets output signal 103 to a low state, and a negative pulse on reset signal 99 resets output signal 103 to a high state. An output from NAND gate 96 connects to set signal 97 of the latch. A set pulse is only created if signal 93 has a positive pulse longer in duration than signal delay 94. An output from OR gate 98 connects to reset signal 99 of the latch. A reset pulse is created when signal 93 has a negative pulse longer in duration than signal delay 94. Signal 103 (output from the latch) is inverted by an inverter 104 to produce output 70.

Figure 5:
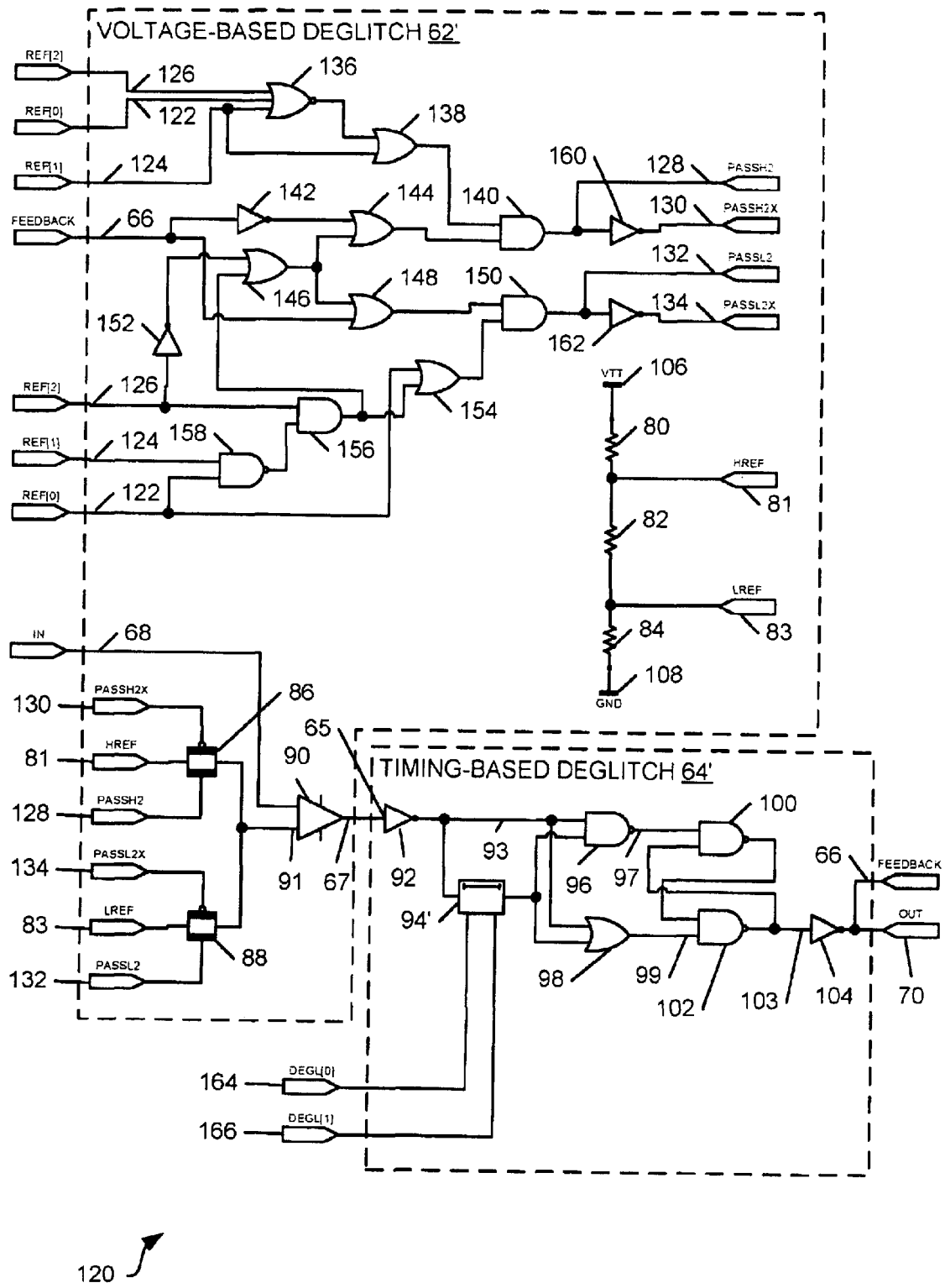
FIG. 5 is a schematic design of one two-dimensional deglitch filter with selectable reference voltages for a voltage-based deglitch filter and selectable signal delay duration for a timing-based deglitch filter.

FIG. 5 illustrates one example of an enhanced two-dimensional deglitch filter 120. Enhanced two-dimensional deglitch filter 120 has additional inputs and circuitry that override feedback signal 66, thereby making a selectable reference voltage for negative input 91 of differential receiver 90. Inputs REF [0], REF [1] and REF [2] select reference voltages for voltage-based deglitch filter 62' as defined in Table 1. Using feedback signal 66, logic components 136 through 162 provide functionality to select rising-edge reference 81 or falling-edge reference 83 for input to differential receiver 90, or to select a reference voltage for input to differential receiver 90 as defined by Table 1.

HREF 81 and LREF 83 are formed by a resistor network consisting of three resistors 80, 82 and 84 connected in series across bus supplied power VTT 106 and GND 108. Resistor 80 connects to VTT 106 and resistor 82. Falling-edge reference LREF 83 is obtained from the junction of resistors 82 and 84. Rising-edge reference HREF 81 is obtained from the junction of resistors 80 and 82.

Signals PASSH2 128 and PASSH2X 130 control pass gate 86 that switches rising-edge reference HREF 81 to negative input 91 of differential receiver 90. Signals PASSL2 132 and PASSL2X 134 control pass gate 88 that switches falling-edge reference LREF 83 to negative input 91 of differential receiver 90. A high speed digital signal received at input 68 connects to a positive input of differential receiver 90. An output from differential receiver 90 (i.e., signal 67 from voltage-based deglitch filter 62') is input to timing-based deglitch filter 64'.

Timing-based deglitch filter 64' is substantially the same as timing-based deglitch filter 64, FIG. 4, except for an alternate signal delay 94'. Signal delay 94' has two additional inputs, DEGL [0] 164 and DEGL [1] 166, that adjust the duration of timing-based deglitch filter 64' to optimal operation. Table 2 defines example timing settings for signal delay 94'.

TABLE 1

Voltage Reference Settings

| FUNCTION | Hysteresis | VREF = 0.65 | VREF = 0.75 | VREF = 0.85 |
|---|---|---|---|---|
| REF[2] | 1 | 0 | 0 | 0 |
| REF[1] | 1 | 0 | 1 | 1 |
| REF[0] | 1 | 1 | 1 | 0 |

TABLE 2

Timing Settings (Nominal Case)

| Duration | 180 ps | 370 ps | 500 ps | 620 ps |
|---|---|---|---|---|
| DEGL[0] | 0 | 1 | 0 | 1 |
| DEGL[1] | 0 | 0 | 1 | 1 |

As appreciated by those having ordinary skill in the art, two-dimensional deglitch filter 120 may be powered by bus power VTT 106 and bus ground GND 108. As bus VTT 106 voltage is reduced, GEW 47, FIG. 2, typically increases; however, the signal delay duration of timing-based deglitch filter 64 also increases as VTT 106 voltage is reduced, resulting in continued deglitching performance.

FIG. 6 is a flowchart illustrating one process 200 for deglitching a high speed digital signal. Process 200 is, for example, suitable to illustrate operation of two-dimensional deglitch filter 38. Process 200 starts at step 202 and continues with step 204. Step 204 is a decision. If the output 70 is low, process 200 continues with step 206; otherwise, process 200 continues with step 214.

Step 206 is a decision. If input signal 68 is greater than rising-edge reference 81, then process 200 continues with step 208; otherwise, process 200 continues with step 204.

Step 208 is a decision. If the period of signal delay 94 has expired, process 200 continues with step 210; otherwise process 200 continues with step 204.

Step 210 sets the output signal to high. Step 212 then restarts signal delay 94. Process 200 continues with step 204.

Step 214 is a decision. If input signal 68 is less than falling-edge reference 83, then process 200 continues with step 216; otherwise, process 200 continues with step 204.

Step 216 is a decision. If the period of signal delay 94 has expired, process 200 continues with step 218; otherwise process 200 continues with step 204.

Step 218 sets the output signal to low. Step 220 then restarts signal delay 94. Process 200 continues with step 204.

The use of feedback 66 from timing-based deglitch filter 64 in selecting rising-edge and falling-edge reference voltages 81 and 83, respectively, in voltage-based deglitch filter 62 provides enhanced glitch noise filtering for high speed digital signals received via bus 34. In particular, the use of feedback 66 in selecting the rising-edge and falling-edge reference voltages 81 and 83, respectively, reduces the GEW in logical signal 67, thereby reducing the required duration of signal delay 94'.

Use of feedback signal 66 may increase the effectiveness of the amount of hysteresis when adjusting rising-edge and falling-edge reference voltages 81 and 83, respectively. Further, when considering the variation in the duration of signal delay 94' due to manufacturing tolerances, VTT 106 variation and temperature variation, the shorter duration of signal delay 94' also increases operational tolerance; this increased tolerance is not found in circuitry of the prior art when a voltage-based deglitch filter is concatenated with a timing-based deglitch filter. In the prior art, the width of the glitch noise in a signal passed from the voltage-based deglitch filter to the timing-based deglitch filter is equal to GEWW 49, FIG. 2, resulting in longer signal delay duration requirements.

Additional control of rising-edge and falling-edge reference voltages 81 and 83, and duration of signal delay 94', facilitate testing and tuning of enhanced two-dimensional deglitch filter 120. The rising-edge and falling-edge references may define an input hysteresis of the voltage-based deglitch filter.

In certain embodiments, the glitch noise that passes through the voltage-based deglitch filter is thus removed by the signal delay function of the timing-based deglitch filter provided the width of the glitch noise is smaller than the predefined minimum valid pulse width. In certain embodiments, the timing-based deglitch filter filters the glitch noise with a time duration that is less than the predetermined minimum valid pulse width. Signal delay 94 may be used to define the predetermined minimum valid pulse width.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall there between.

What is claimed is:

1. A system for removing glitch noise from a signal, comprising:

a voltage-based deglitch filter that receives said signal; and a timing-based deglitch filler connected to an output of the voltage-based deglitch filter, having an input to the voltage-based deglitch filter in feedback with an output from the timing-based deglitch filter.

2. The system of claim 1, the timing-based deglitch filter filtering the glitch noise with a time duration that is less than a predetermined minimum valid pulse width.

3. The system of claim 2, the timing-based deglitch filter comprising a signal delay defining the predetermined minimum valid pulse width.

4. The system of claim 3, the timing-based deglitch filter comprising a latch for setting the output based upon a comparison between (a) a logical signal between the voltage-based deglitch filter and the timing-based deglitch filter and (b) the logical signal after the signal delay.

5. The system of claim 3, further comprising one or more logical inputs to the signal delay to set the minimum valid pulse width.

6. The system of claim 1, the voltage-based deglitch filter comprising a rising-edge reference and a falling-edge reference, the rising-edge reference and falling-edge reference defining an input hysteresis, further comprising differential first and second pass gates, controlled by the feedback, to select one of the rising-edge and falling-edge references, further comprising a differential receiver connected to the pass gates to compare the signal lo the selected one of the rising-edge and falling-edge reference, to output a logic signal at the output of the voltage-based deglitch filter, for input to the timing-based deglitch filter.

7. The system of claim 6, the voltage-based deglitch filter comprising a plurality of logical elements for overriding the feedback, further comprising one or more logical inputs to selectively control the logical elements to select one of the rising-edge or falling-edge references as input to the differential receiver.

8. The system of claim 7, the voltage-based deglitch filter comprising one or more logical inputs to selectively control the logical elements to select a midpoint between the rising-edge and falling-edge references as input to the differential receiver.

9. The system of claim 6, the rising-edge reference and falling-edge reference being defined by a resistor network.

10. A method for filtering glitch noise from a signal, comprising the steps of:
    concatenating a voltage-based deglitch filter with a timing-based deglitch filter;
    feeding back an output signal from the timing-based deglitch filter to the voltage-based deglitch filter; and
    filtering the signal through the voltage-based deglitch filter and the timing-based deglitch filter.

11. The method of claim 10, the step of filtering further comprising the step of
    filtering glitch noise within the timing-based deglitch filter with a time duration that is less than a predetermined minimum valid pulse width.

12. The method of claim 11, the step of filtering within the timing-based deglitch filter further comprising setting the time duration through a signal delay.

13. The method of claim 12, the step of filtering further comprising the step of
    setting the signal delay duration to the minimum valid pulse width.

14. The method of claim 10, further comprising the step of overriding feedback from the timing-based deglitch filter by controlling inputs to one or more logical elements within the voltage-based deglitch filter.

15. The method of claim 14, the step of overriding comprising selecting one of a rising-edge reference, a falling-edge reference, and a mid-point between the rising-edge and falling-edge references.

16. The method of claim 10, the step of filtering comprising the steps of (a) communicating the glitch noise from the voltage-based deglitch filter to the timing-based deglitch filter within a logical signal when the noise glitch exceeds an input hysteresis of the voltage-based deglitch filter, and (b) removing the glitch noise from theological signal within the timing-based deglitch filter when the glitch noise from the logical signal has a width that is less than a predetermined signal delay duration within the timing-based deglitch filter.

17. Apparatus for filtering glitch noise from a signal, comprising:
    voltage-based deglitch filter means having an input for receiving the signal; and
    timing-based deglitch filter means connected to an output of the voltage-based deglitch filter means wherein the input to the voltage-based deglitch filter means is in feedback with an output of the timing-based deglitch filter means and wherein the signal is filtered through both the voltage-based deglitch filter means and the timing-based deglitch filter means to the output of the timing-based deglitch filter means.

18. Apparatus of claim 17, the timing-based deglitch filter means comprising means for filtering a signal at the output of the voltage-based deglitch filter means with a time duration that is less than a predetermined minimum valid pulse width.

19. Apparatus of claim 18, further comprising means for setting the time duration through a signal delay.

20. Apparatus of claim 18, further comprising means for setting the time duration to the minimum valid pulse width.

* * * * *